United States Patent [19]
Ohsono

[11] Patent Number: 6,153,892
[45] Date of Patent: Nov. 28, 2000

[54] SEMICONDUCTOR DEVICE AND METHOD FOR MANUFACTURE THEREOF

[75] Inventor: Katsuhiro Ohsono, Tokyo, Japan

[73] Assignee: NEC Corporation, Tokyo, Japan

[21] Appl. No.: 09/022,986

[22] Filed: Feb. 12, 1998

[51] Int. Cl.[7] .............................. H01L 23/58; H01L 29/76
[52] U.S. Cl. .......................... 257/48; 257/345; 257/398; 257/399; 257/401
[58] Field of Search .............................. 257/48, 345, 398, 257/399, 401

[56] References Cited

U.S. PATENT DOCUMENTS

| | | | |
|---|---|---|---|
| 4,574,467 | 3/1986 | Halfacre et al. | 257/376 |
| 4,697,199 | 9/1987 | De Graaff et al. | 257/398 |
| 5,670,816 | 9/1997 | Hatano et al. | 257/394 |
| 5,684,304 | 11/1997 | Smears | 257/532 |
| 5,712,492 | 1/1998 | Kokubun | 257/345 |
| 5,828,081 | 10/1998 | Yoshida et al. | 257/48 |
| 5,838,023 | 11/1998 | Goel et al. | 257/48 |
| 5,895,954 | 4/1999 | Yasumura et al. | 257/345 |

FOREIGN PATENT DOCUMENTS

| | | |
|---|---|---|
| 63-56930 | 3/1988 | Japan . |
| 2-304949 | 12/1990 | Japan . |
| 406005684 | 1/1994 | Japan ........................................ 257/48 |

*Primary Examiner*—Steven H. Loke
*Assistant Examiner*—Ori Nadav

[57] ABSTRACT

The present invention is a semiconductor device comprising an isolated N-type diffusion layer formed on part of a P-type semiconductor substrate or P-type well, a P-type channel barrier region formed so as to contact at least one part of the N-type diffusion layer, and an electrode drawn from the N-type diffusion layer through a contact hole; and constituting check elements to check the state of the P-type channel barrier region through measuring the junction withstand voltage of the N-type diffusion layer. With the aforementioned constitution, the state of the P-type channel barrier region can be checked with good sensitivity and without true breakdown of the thin oxide film having the same thickness as the gate oxide and influence from variations in the thickness of the field oxide, because the state of the P-type channel barrier region is checked by measuring the junction withstand voltage of the N-type diffusion layers. Also, even if the P-type channel barrier region is misplaced in relation to the N-type diffusion layer where the P-type channel barrier region is formed around the N-type diffusion layer, this does not influence the measured value of the junction withstand voltage.

1 Claim, 13 Drawing Sheets

F I G. 1
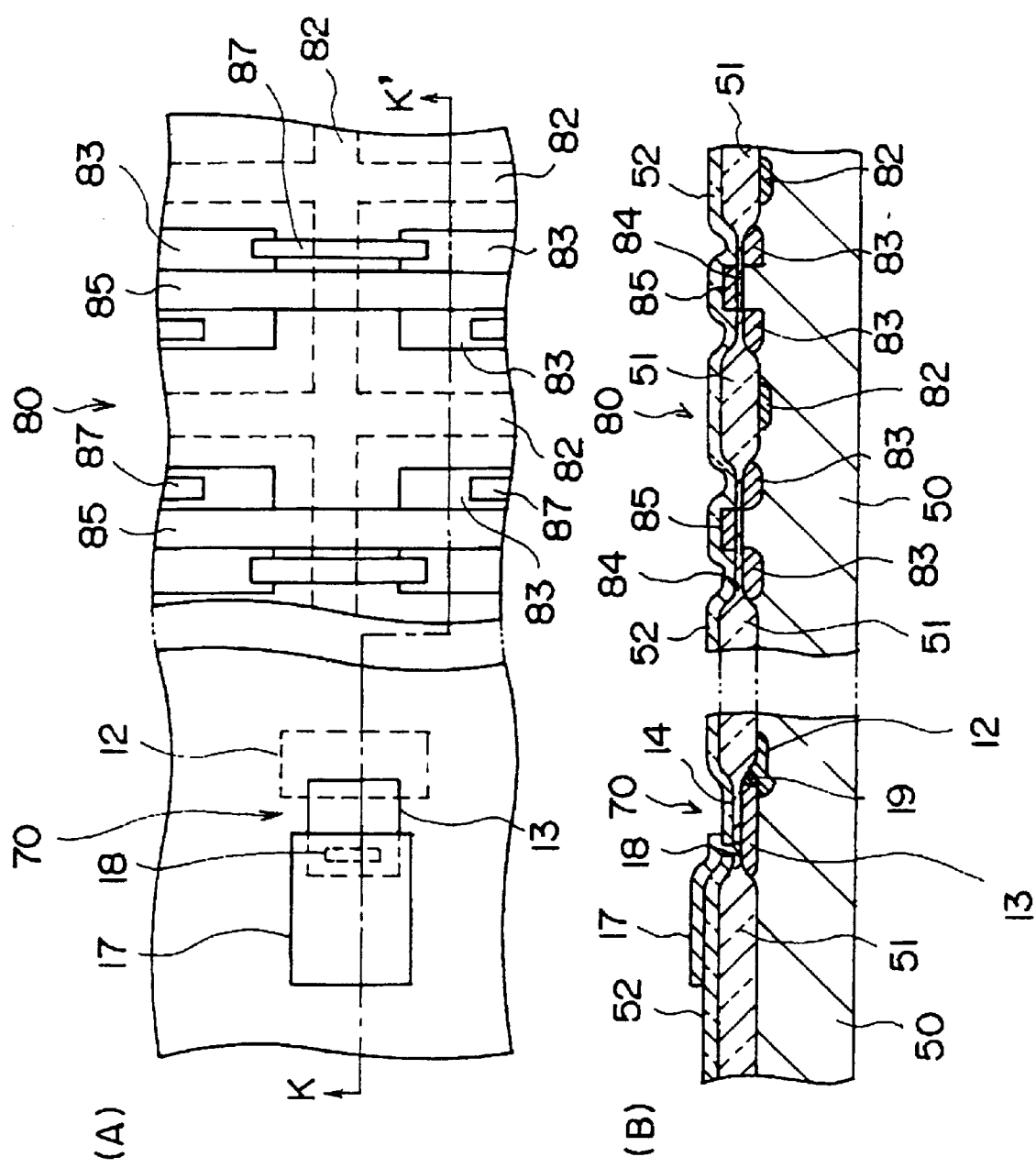

F I G.2
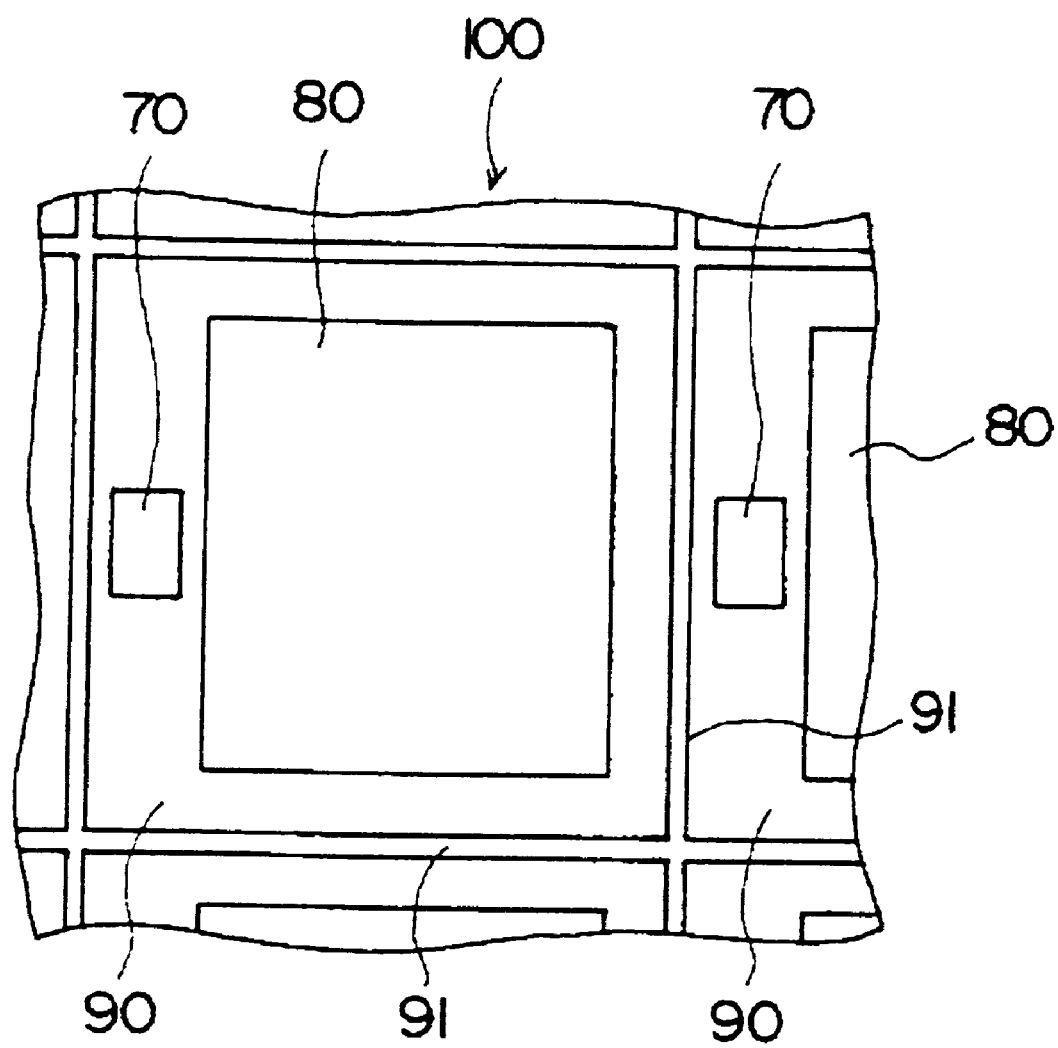

F I G. 3
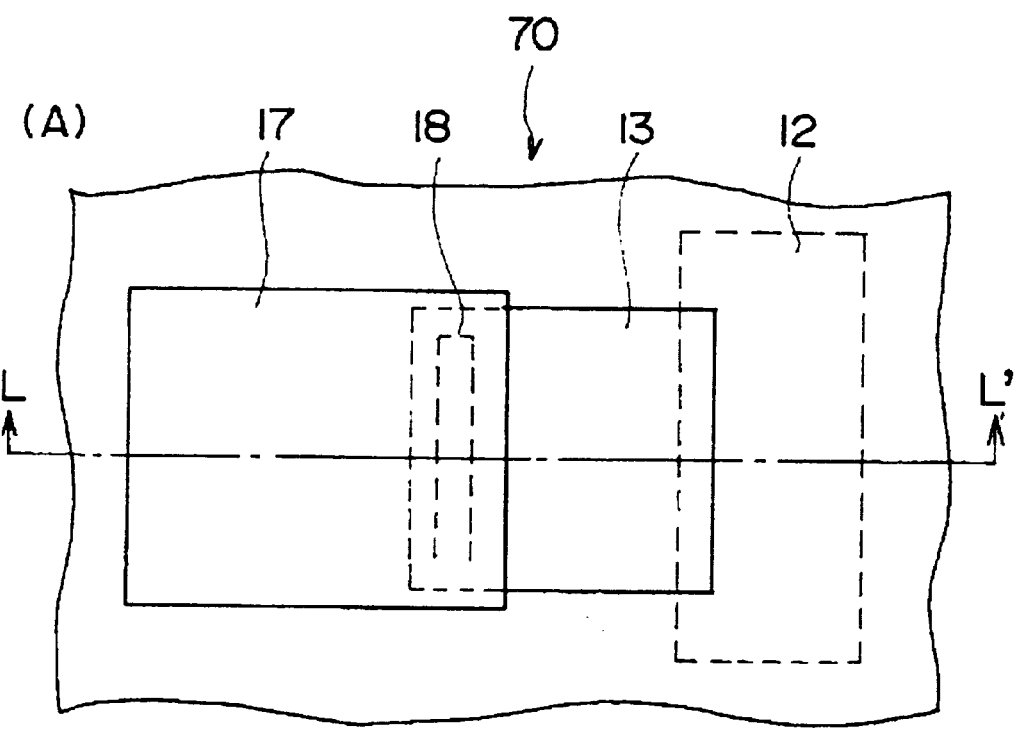
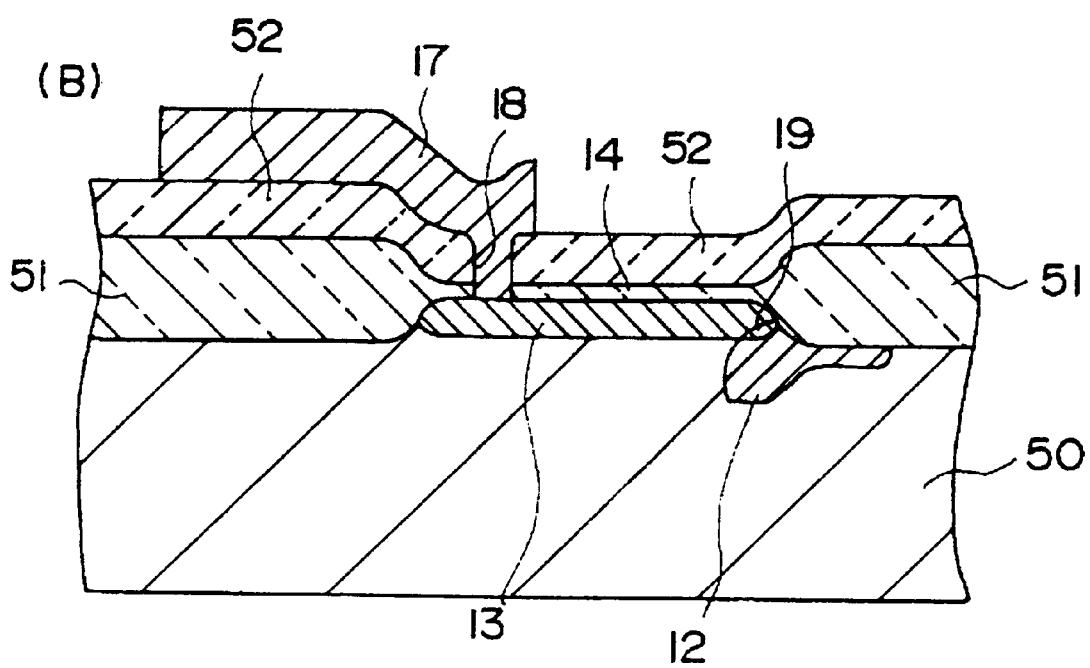

(A)

(B)

(A)

(B)

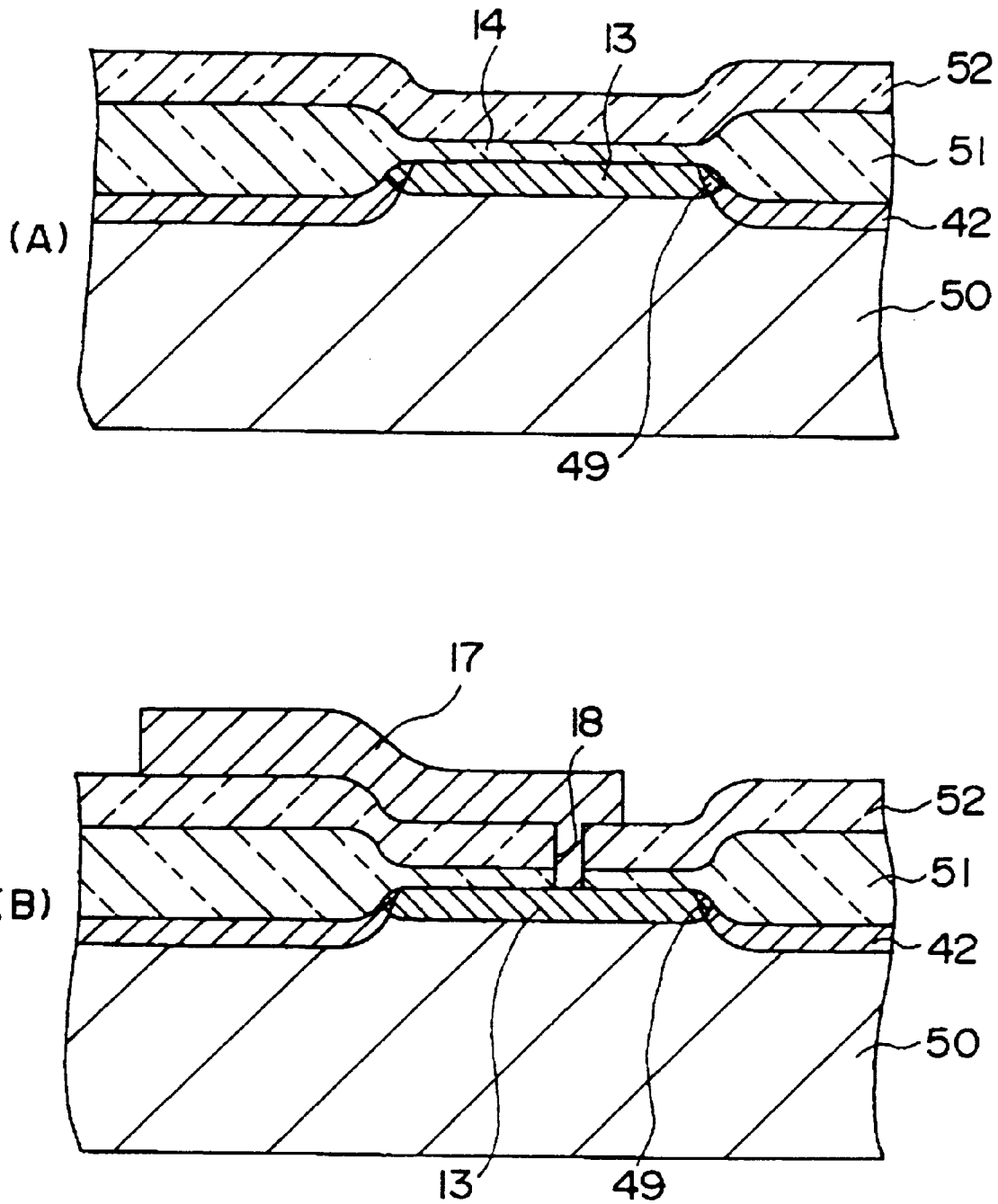
F I G. 12

SEMICONDUCTOR DEVICE AND METHOD FOR MANUFACTURE THEREOF

BACKGROUND OF THE INVENTION

1. Field of the Invention

The present invention relates to a semiconductor device and method for manufacture thereof, and more particularly to a semiconductor device and method for manufacture thereof wherein is checked the state of the formation of a P-channel barrier region or a guard ring region (these are integrated in these specifications and abbreviated as "channel barrier region") directly below a field oxide.

2. Description of the Related Art

A problem is the increase in passive current consumption because of cosmic rays (for example, g rays) when a trapping semiconductor device is used as a part of space instrumentation. This is because hole-electron pairs are generated in the field oxide by irradiation with g rays and so forth, then the holes, which have low mobility, are captured at the interface of the silicon substrate and oxidized silicon and a stationary positive charge is generated. In other words, the surface of the silicon substrate directly beneath the field oxide of a parasitic NMOS transistor reverses (in effect, the threshold voltage becomes low) because of this stationary positive charge and leaked current flows and causes the passive current consumption to increase. In order to prevent this increase in leaked current, a high density, P-type channel barrier region must be established directly beneath the field oxide. Also, in order to prevent a drop in withstand voltage in this case, it is also provided that the P-type channel barrier region be formed so as to be separated from the N-type diffusion layers such as the N-type source and drain regions.

For example, the technology for forming the aforementioned high density P-type channel barrier region so as to be separated from N-type diffusion layers is disclosed in Japanese Patent Laid-open Publication No. 2-304949, where P-type impurities are diffused in the substrate before the formation of a thick field oxide, and in Japanese Patent Laid-open Publication No. 6-140502, where P-type impurities are implanted in the substrate through the field oxide with high energy after the formation of a thick field oxide.

In either case, it is necessary to check the construction of the P-type channel barrier region, specifically the separation of the elements, and check elements are installed for this purpose. The conventional check elements are explained with reference to FIG. 13. In FIG. 13, (A) is a planar view and (B) is a sectional view of (A) at the line W–W'.

A field oxide 51 is formed on the P-type semiconductor substrate 50; N-type diffusion layers 63S, 63D are formed on either side of the location 51G on this field oxide 51. Directly below this field oxide 51G, a P-type channel barrier region 62 is formed so as to be separate from the N-type diffusion layer 63S, 63D, in order to improve element separation, and a thin oxide film 64 is formed thereon. Also, a polysilicon electrode 66 is formed above the field oxide 51G and extends over the thin oxide film 64. Aluminum electrodes 67S, 67D are each drawn through contact holes 68, which pass through the thin oxide film 64 from the BPSG film 52, which is an interlayer insulating film applied over the entirety, and extend to the N-type diffusion layers 63S, 63D. An aluminum electrode 67G is drawn through a through hole 65 which passes through the BPSG film 52 and extends to the polysilicon electrode 66.

Being the check elements in FIG. 13, the P-type channel barrier region 62, N-type diffusion layers 63S, 63D, thin oxide film 64, polysilicon electrode 66, and aluminum electrodes 67S, 67D, 67G are formed at the same time as the P-type channel barrier region, N-type source and drain regions, gate oxide, polysilicon gate electrode, and aluminum electrode of an insulated gate field effect transistor (abbreviated below as "MOS transistor"), which are circuit elements in the circuit element region established on the same substrate. The field oxide 51, 51G and interlayer insulating film 52, which are check elements in FIG. 13, are formed at the same time as the field oxide and interlayer insulating film in the circuit element region.

The parasitic MOS transistor structure is formed with these check elements: the N-type diffusion layer 63S becomes the N-type source region, the N-type diffusion layer 63D becomes the N-type drain region, the polysilicon electrode 66 becomes the gate electrode, and the field oxide 51G becomes the gate insulating film. Then a probe is brought into contact therewith and the size of the aluminum electrodes 67S, 67D, 67G, for measuring this parasitic MOS transistor, is 100 $\mu$m square (area $1 \times 10^4$ $\mu m^2$), determined according to the probing precision of the measurement device. Generally the following measurements are performed to evaluate element separation using these elements. In other words, 5 V is applied to the drain region 63D and 0 V (ground potential) is applied to the source region 63S and substrate 50; the gate voltage applied to the gate electrode 66 is gradually increased, and the gate voltage, at which the drain current becomes a certain value (1 $\mu$A), is found. This gate voltage is called the threshold voltage of the parasitic MOS transistor; a higher value of this voltage indicates that element separation is higher.

The threshold voltage of this parasitic MOS transistor becomes 35 V for a film thickness of 450 nm of the field oxide 51G formed by the selective thermal oxidation method, called the LOCOS method, and especially when element separation is not improved. The threshold voltage of this parasitic MOS transistor becomes 40 V or more when a high density P-type channel barrier region 62 is established and element separation is improved.

As discussed above, the state of element separation in a semiconductor device was previously checked using the check elements shown in FIG. 13.

However, this prior art has the following problems.

The polysilicon electrode 66 and N-type diffusion layers 63S, 63D in FIG. 13 are placed on top of each other with the thin oxide film 64, which acts as the gate oxide, a circuit element, therebetween. In this section, the insulator is destroyed when a voltage greater than or equal to the true breakdown field (generally 10 MV/cm) of this thin oxide film 64 is applied. Recent gate oxide thicknesses have been 20 nm; therefore, the film thickness of the thin oxide film 64 has also been 20 nm. The oxide 64 in this section is destroyed when the gate voltage exceeds 20 V.

Additionally, the threshold voltage of the parasitic MOS transistor becomes 40 V or more when the P-type channel barrier region is established and element separation improved. Therefore it becomes impossible to evaluate the state of this P-type channel barrier region.

It is necessary to make a high density P-type channel barrier in order to prevent an increase in current leakage due to the stationary positive charge generated in this field oxide. In order to monitor the state of this density, the threshold voltage of the aforementioned parasitic MOS transistor is measured. However, the value of this threshold voltage is easily influenced by variations in thickness of the field oxide and a sensitive check of element separation according to the density of the P-type channel barrier is not possible.

Furthermore, three aluminum electrodes 67S, 67D, 67G are required in order to evaluate this, as shown in FIG. 13. Because the size of one of the aluminum electrodes is 100 $\mu$m square as discussed above, a minimum area of $3\times10^4$ $\mu m^2$ is required to form an aluminum electrode pattern comprising these three aluminum electrodes. Check elements requiring a large area as shown in FIG. 13 are not desirable because the area used by the original circuit element region should be increased and the area occupied by the check elements be made as small as possible.

Furthermore, with the check elements in FIG. 13, the orientation and degree of misplacement between the N-type diffusion layers or field oxide and the P-type channel barrier region cannot be easily evaluated.

SUMMARY OF THE INVENTION

It is an object of the present invention to provide a semiconductor device and method for manufacture thereof wherein the semiconductor device has check elements for checking the construction of a P-type channel barrier region with good sensitivity, on a small pattern area, and without true breakdown of an oxide having the same thickness as a gate oxide, and thereby being able to evaluate element separation.

It is another object of the present invention to provide a semiconductor device and method for manufacture thereof wherein the misplacement of a channel barrier region from a field oxide or N-type diffusion layer, such as source and drain regions formed on the semiconductor device, can be easily evaluated.

The present invention to attain the foregoing objects is characterized in that it is a semiconductor device which is provided a flat, square N-type diffusion layer isolated from part of the P-type semiconductor device substrate or P-type well, a P-type channel barrier region formed so as to contact at least one edge of the N-type diffusion layer, and an electrode drawn through a contact hole from the N-type diffusion layer, and which comprises check elements to check the state of the P-type channel barrier region by the measurement of the junction withstand voltage of the N-type diffusion layer.

The P-type channel barrier region can be formed around the N-type diffusion layer. Otherwise, the planar form of the P-type channel barrier region is square, four N-type diffusion layers formed so as to be isolated and each contact an edge of the P-type channel barrier region, and each electrode can be drawn from the four N-type diffusion layers. Furthermore, the method for manufacturing the aforementioned semiconductor device comprises a process whereby the P-type channel barrier region is formed through ion implantation of boron through the field oxide under the following conditions: a resist pattern is the mask, energy level of 100 keV to 150 keV, and dose of $10^{12}$ cm$^{-2}$ to $10^{13}$ cm$^{-2}$; and thereafter a process wherein the N-type diffusion layers are formed and electrodes drawn therefrom.

With the foregoing constitution, the junction withstand voltage of the N-type diffusion layers is measured and the state of the P-type channel barrier region is checked; therefore, the P-type channel barrier region can be checked with good sensitivity, without influence by the variations of film thickness in the field oxide, and without true breakdown of the oxide having the same film thickness as the gate oxide. Also, it is possible to check the construction of the P-type channel barrier region in a small pattern area because there need only be one drawn electrode. The P-type channel barrier region might be formed with slippage in relation to the N-type diffusion layers when the P-type channel barrier region is formed around the N-type diffusion layers. Should that be the case, that does not influence the measured value of the junction withstand voltage.

Meanwhile, the misplacement of a channel barrier region from a field oxide or N-type diffusion layer, such as source and drain regions formed on the semiconductor device, can be easily evaluated because of the constitution wherein four N-type diffusion layers are formed so as to be isolated and each contact an edge of the P-type channel barrier region, and each electrode is drawn from one of the four N-type diffusion layers. The high density P-type channel barrier region can be checked because the P-type channel barrier region is formed through ion implantation of boron through the field oxide with a resist pattern as the mask.

BRIEF DESCRIPTION OF THE DRAWINGS

FIG. 1 is a drawing to show a semiconductor device in a first embodiment of the present invention; (A) is a planar view; (B) is a sectional view of (A) at line K–K' and seen from the direction of the arrow;

FIG. 2 is a planar view to show the wafer of the semiconductor device which is the subject of the present invention;

FIG. 3 is a drawing to show a detail of a check element in the semiconductor device in a first embodiment of the present invention; (A) is a planar view; (B) is a sectional view of (A) at line L–L' and seen from the direction of the arrow;

FIG. 12 is a sectional view show the order of the processes following those shown in FIG. 11.

DESCRIPTION OF THE PREFERRED EMBODIMENTS

Figure 4:
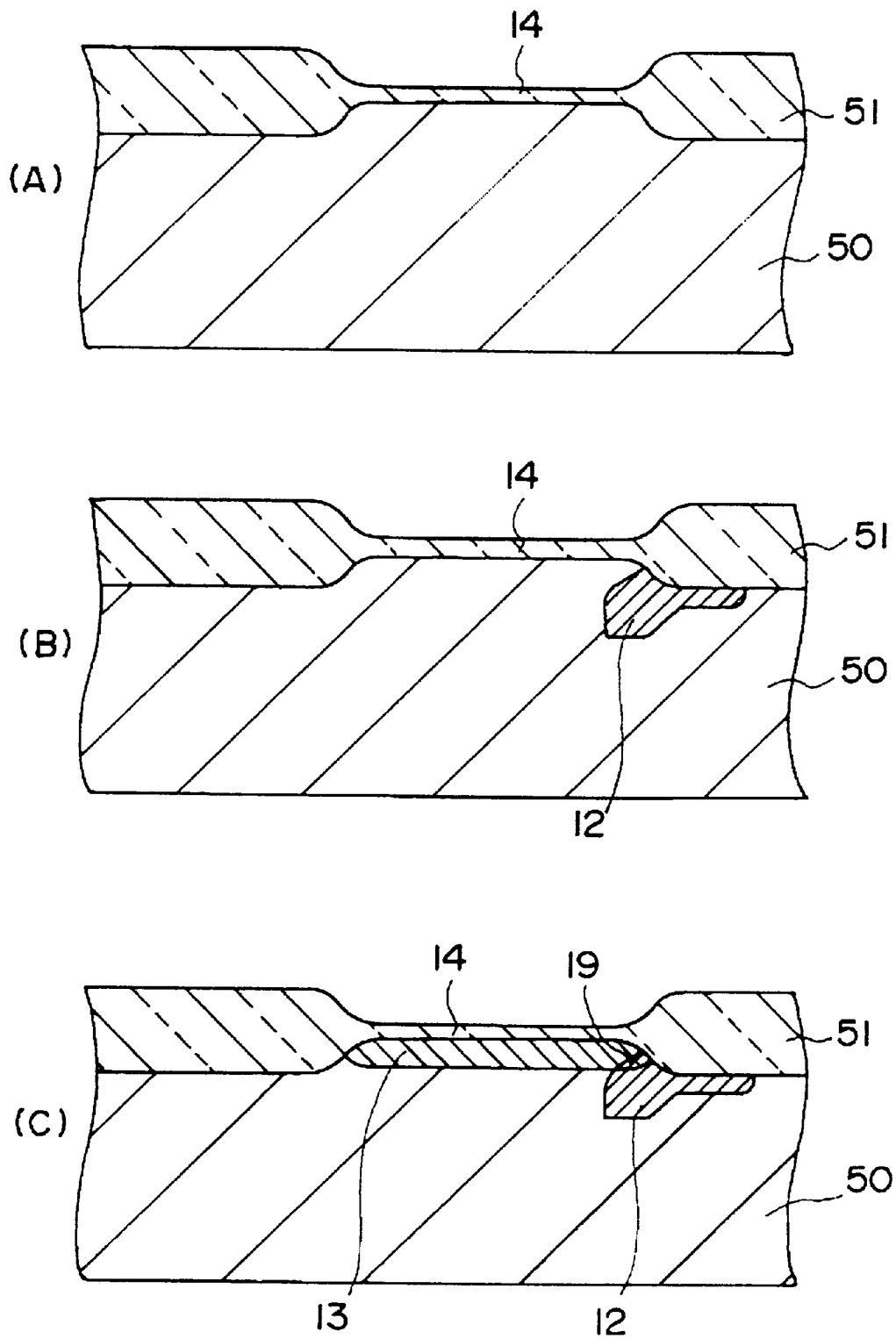
FIG. 4 is a sectional view showing the order of the processes of the method for manufacturing the semiconductor device in a first embodiment of the present invention.

Below the present invention is explained with reference to the figures.

FIG. 1 is a drawing to show an semiconductor device of a first embodiment of the present invention; (A) is a planar view and (B) is a sectional view of (A) at line K–K'. FIG. 2 is a planar view to show the state of the wafer of the entire semiconductor device in the embodiment of the present invention. Also, FIG. 3 is a drawing to show a detail of the check elements in FIG. 1; (A) is a planar view and (B) is a sectional view of (A) at line L–L'.

In FIG. 2, a plurality of semiconductor devices 90 are compartmentalized and manufactured within the section 91 on the semiconductor wafer 100. Then a circuit element region 80, for forming circuit elements and constituting the original integrated circuit, and a check element region 70, for forming the check elements of the present invention to monitor the formation of the P-type channel barrier region in the circuit element region 80, are established on each of the semiconductor devices 90.

As in FIG. 1, a thick field silicon oxide film 51 is formed through selective oxidation on the P-type semiconductor substrate 50, or rather the principal plane of the P-type well 50 on the semiconductor substrate. A plurality of MOS transistors, comprising an N-type source and drain region 83, gate silicon oxide film 84, and polysilicon gate electrode 85, are formed on the circuit element region 80 of this P-type semiconductor substrate 50, or rather the P-type well 50 of the semiconductor substrate. The BPSG film 52 is formed as an interlayer insulation film over the entirety and an integrated circuit is constituted with the polysilicon gate electrodes 85 established to be shared with other transistors and aluminum electrode wires 87 connecting other N-type source and drain regions 83.

Then a P-type channel barrier region 82 having a high concentration of impurities is formed separate from the N-type source and drain regions 83 on the bottom portion of the field oxide 51 and prevents undesirable current leakage between the MOS transistors. On the check element region 70 on the P-type semiconductor substrate 50, or rather the P-type well 50 of the semiconductor substrate as shown in detail in FIG. 3, an island of the N-type diffusion layer 13 surrounded by the field oxide 51 is formed at the same time as the N-type source and drain regions 83. The thin silicon oxide film 14 thereon is formed at the same time as the gate oxide 84. An interlayer insulating film 52, identical to the circuit element region, is formed. A contact hole 18 is formed and extends from the interlayer insulating film 52, through the thin oxide film 14, to the N-type diffusion layer 13. An aluminum electrode 17, extending through the contact hole 18 to above the interlayer insulating film 52, is formed at the same time as the aluminum electrode wires 87. The area of this aluminum electrode 17 is 100 $\mu$m square (area $1 \times 10^4$ $\mu m^2$) so as to be brought into contact with a probe to measure the withstand voltage characteristics of this check element.

Furthermore, a P-type channel barrier region 12 for checking is formed so as to be covered with the N-type diffusion layer 13 and contact location 19. These check elements, the P-type channel barrier region 12 and P-type channel barrier region 82 of the circuit element region, are formed at the same time through ion implantation of P-type impurities through the field oxide 51 and an alloying heat treatment thereafter. Consequently, the concentration of impurities, the depth of diffusion, and so forth, of both are the same.

Then, in the check elements, the substrate electrode (not pictured) to provide the substrate potential to the P-type semiconductor substrate 50, or rather the P-type well 50 of the semiconductor substrate, is made 0 V (ground potential). A probe is brought into contact with the aluminum electrode 17 and positive voltage is applied; this voltage is gradually increased and in this way, the PN junction withstand voltage of the location where the N-type diffusion layer 13 overlaps the P-type channel barrier region 12 is measured. The concentration of impurities in the P-type channel barrier regions 12 and 82 are thereby evaluated and the presence of the P-type channel barrier region is confirmed. Even if the N-type diffusion layer 13 and P-type channel barrier region 12 are slightly separated on the manufacturing mask, the N-type diffusion layer diffuses 0.2 to 0.4 $\mu$m laterally and the P-type channel barrier region diffuses 0.4 to 0.6 $\mu$m; therefore, both may overlap with each other in some locations. Then if the P-type channel barrier region 12 is formed in such a manner that the boron implanted in the N-type diffusion layer diffuses so as to overlap the P-type channel barrier region 12 by 0.2 $\mu$m or more, then the value of the junction withstand voltage of the resulting N-type diffusion layer 13 will reflect the concentration of impurities in areas of the P-type channel barrier region located on the bottom surface of the field oxide 51.

With the present invention in this way, there is no true breakdown of the oxide film 14 which has the same thickness as the gate oxide 84, because the concentration of impurities in the P-type channel barrier region is evaluated with the junction withstand voltage. Also, space is not wasted because there is only one aluminum electrode to contact the probe for measurement. Furthermore, it is possible to check the construction of the P-type channel barrier region with good sensitivity, because there is no influence from the thickness of the field oxide, and thereby element separation can be evaluated.

Next the method for manufacturing the semiconductor device of the first embodiment is explained with reference to FIGS. 4 and 5. As discussed above, only the check elements are illustrated here, because the circuit elements and check elements are manufactured at the same time.

A field oxide 51 is formed selectively by selective oxidation using silicon nitride film as the mask, the so-called LOCOS technique, on the principal plane of a P-type silicon substrate 50 doped with $1 \times 10^{16}$ cm$^{-3}$ of boron. With this field oxide 51, the MOS transistor formation regions of the circuit elements are compartmentalized in the circuit element region; and the island-shaped substrate regions are compartmentalized in the check element formation region by the openings in the field oxide 51. Afterwards, ion implantation is effected as necessary to adjust the threshold value of the voltage for the MOS transistor in the circuit element region; then the gate oxide in the circuit element region and the thin silicon oxide film 14 in the check element region are formed at the same time through thermal oxidation. The thickness of these films is 20 nm (FIG. 4(A)).

Next a resist pattern having a prescribed opening is formed over the entirety of the field oxide 51. Using this as the mask, ion implantation of boron is effected at an energy level of 120 keV and a dose of $1 \times 10^{14}$ cm$^{-2}$. Ions are implanted through the field oxide 51 below the openings in the resist. Through alloying heat treatment after the resist pattern is removed, the P-type channel barrier region is formed in the circuit element region between the circuit elements and the P-type channel barrier region 12 is formed in the check element region near one end of the island-shaped opening of the field oxide 51 (FIG. 4(B).

Next, after the polysilicon gate electrode is formed in the circuit element region, arsenic ions are implanted at an energy level of 70 keV and a dose of $1\times10^{13}$ cm$^{-2}$ using the field oxide 51 and polysilicon gate electrode as a mask. With the subsequent alloying heat treatment, the N-type source and drain regions are formed in the circuit element region. In the check element region, the N-type diffusion layer 13, which overlaps with the P-type channel barrier region 12 at the contact location 19, is formed on the area of the substrate in the form of an island in the opening of the field oxide 51 (FIG. 4(C)).

Next, the BPSG film 52, which becomes in the interlayer insulating film, is formed over then entirety (FIG. 5(A)). The contact hole 18 is formed and the aluminum electrode wiring in the circuit element region and the aluminum electrode 17 in the check element region are formed at the same time through the deposition and patterning of aluminum film (FIG. 5(B)).

Moreover, the source and drain regions of the P-channel MOS transistors are formed and processes such as the channel doping thereof are performed, especially when the CMOS is formed in the circuit element region. However, since these are not directly related to the present invention, an explanation of these is omitted here.

In the aforementioned embodiment, the channel barrier region is formed with high energy ion implantation after the oxidation and formation of the gate oxide and thin oxide film 14, but this ion implantation can also be effected before the oxidation and formation of the gate oxide and thin oxide film 14. Also, the foregoing manufacturing method was explained using a P-type semiconductor substrate, but this may also use the P-type well portion of a P-type semiconductor substrate or an N-type semiconductor substrate (P-type well doped with boron at $10^{16}$ cm$^{-3}$).

Furthermore, the conditions for forming the P-type channel barrier region, which were an energy of 100 keV to 150 keV and a dose of $1\times10^{12}$ cm$^{-2}$ to $5\times10^{16}$ cm$^{-2}$, are appropriate in practice.

Figure 5:
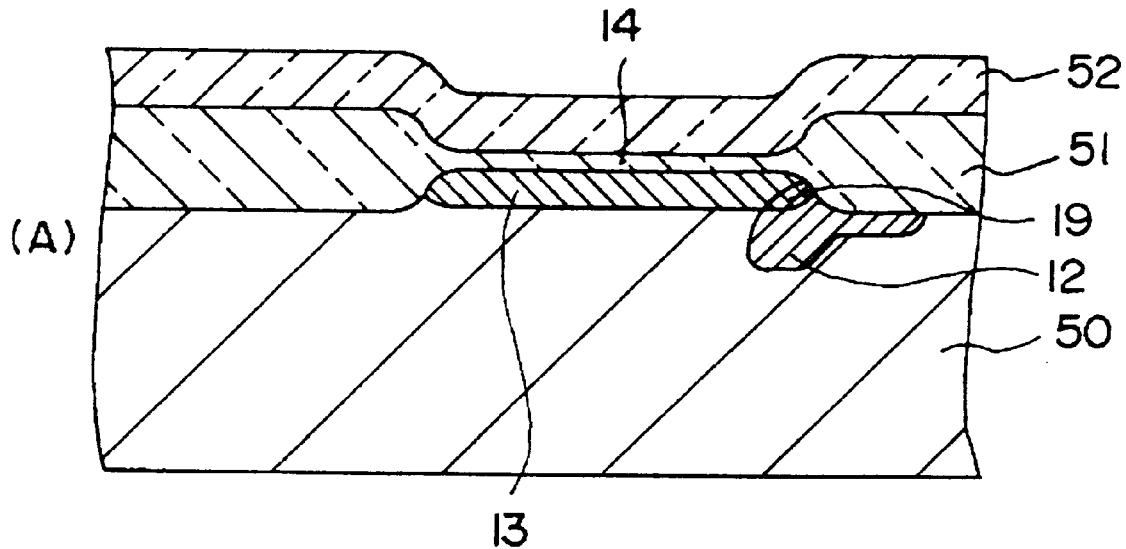
FIG. 5 is a sectional view show the order of the processes following those shown in FIG. 4.
Figure 5:
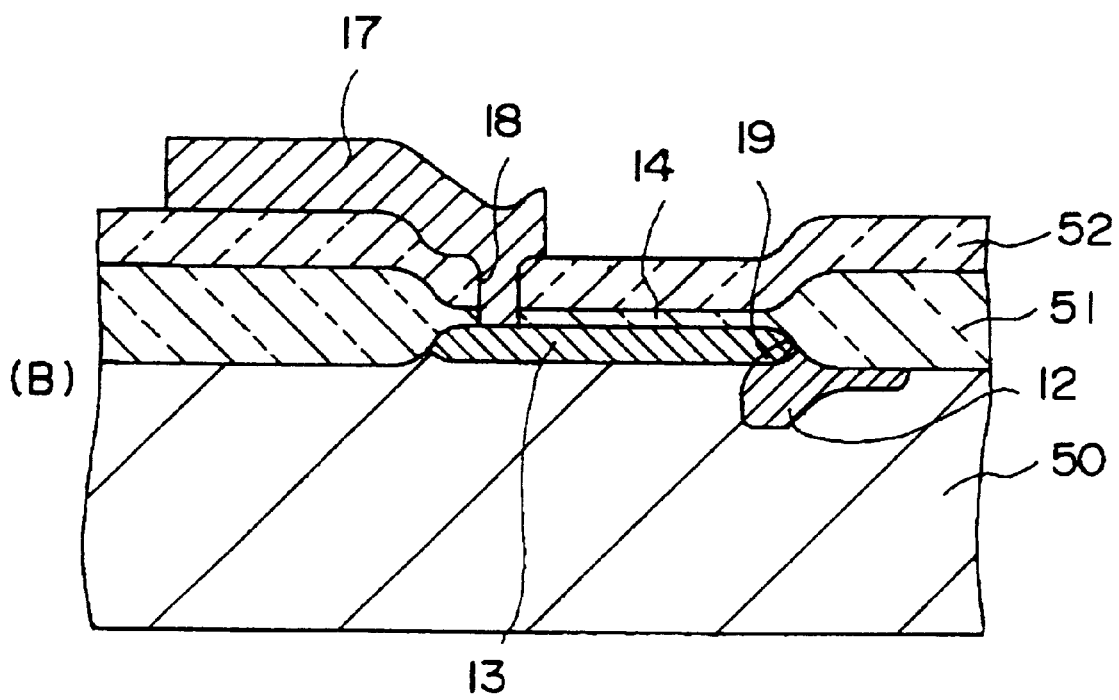

The junction withstand voltage of the element separation produced under the conditions and the process flow in FIGS. 4 and 5 and with the structure in FIGS. 1 and 3, specifically, the junction withstand voltage of the N-type diffusion layer 13 and P-type channel barrier region 12 was 10 V. If the P-type channel barrier region was formed in the same way under other conditions and the dose was changed 20%, this junction withstand voltage changed about 1 V.

Figure 6:
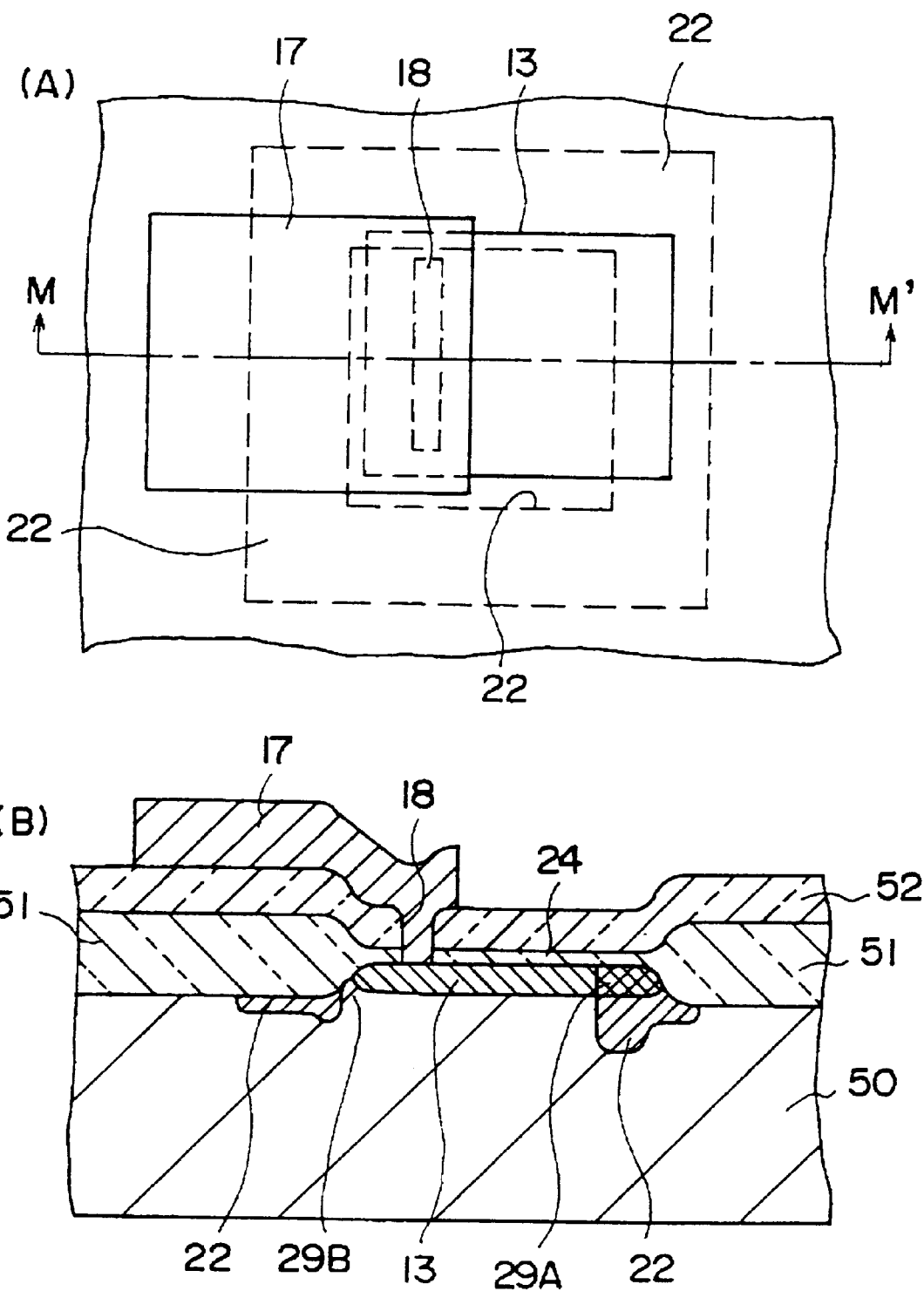
FIG. 6 is a drawing to show the check elements in the semiconductor device in a second embodiment of the present invention; (A) is a planar view; (B) is a sectional view of (A) at line M–M' and seen from the direction of the arrow.
Figure 7:
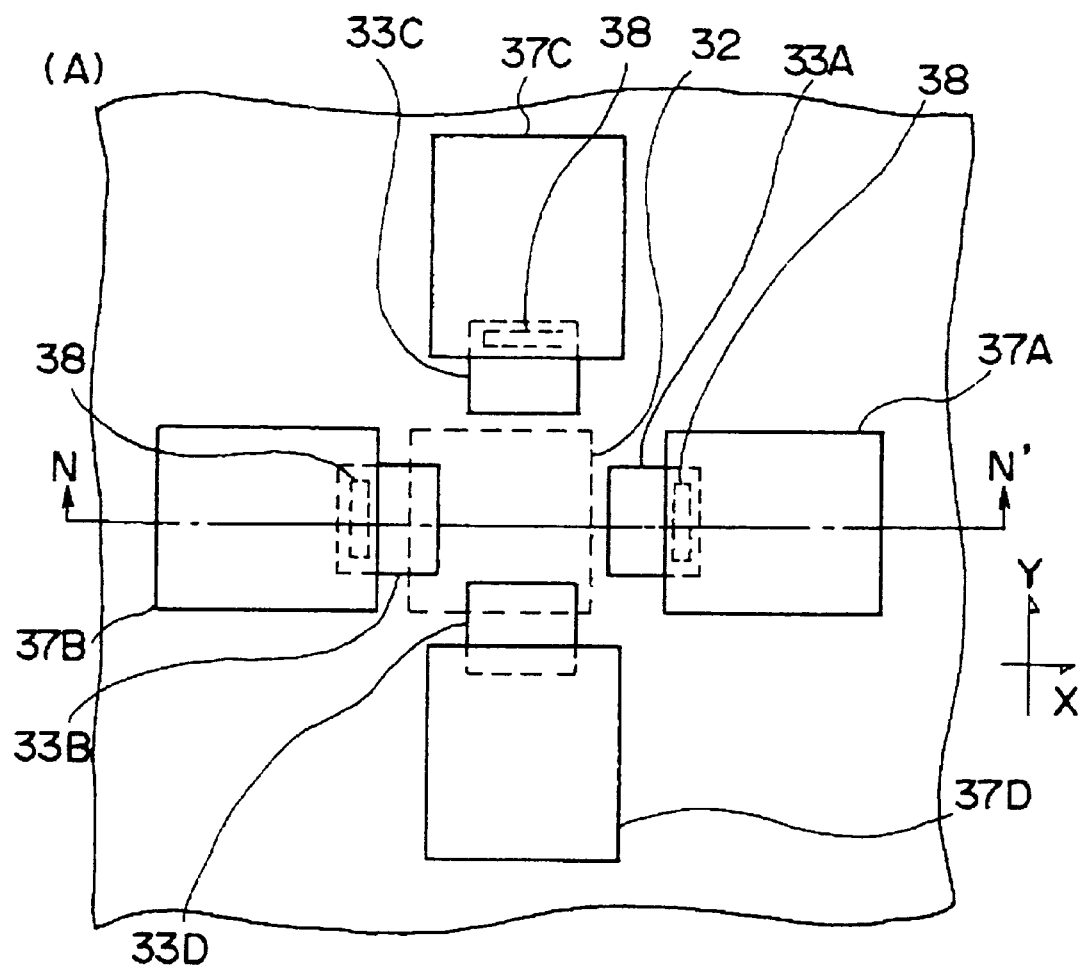
FIG. 7 is a drawing to show the check elements in the semiconductor device in a third embodiment of the present invention; (A) is a planar view; (B) is a sectional view of (A) at line N–N' and seen from the direction of the arrow.
Figure 7:
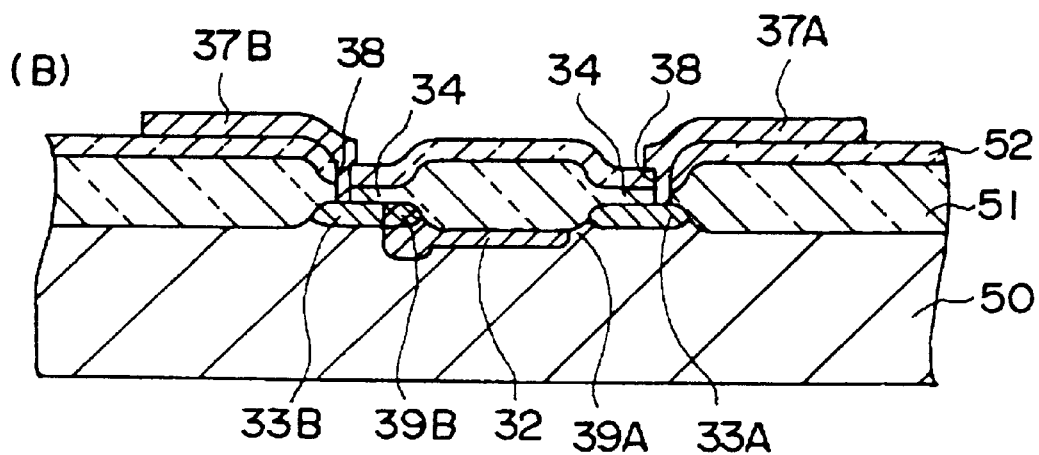

FIG. 6 is a drawing to show the check elements in the semiconductor device of the second embodiment of the present invention; (A) is a planar view and (B) is a sectional view at line M–M' in (A). Also, FIG. 7 is a drawing to show the check elements in the semiconductor device of the third embodiment of the present invention; (A) is a planar view and (B) is a sectional view at line N–N' in (A). In FIGS. 6 and 7 showing the second and third embodiments, the same or similar elements as in FIG. 3, showing the first embodiment, are represented with the same symbols. The manufacturing method and relations to the circuit element region are the same as in FIGS. 1, 2, 4, and 5 of the first embodiment, therefore a redundant explanation thereof is omitted.

In the first embodiment, a P-type channel barrier region 12 was formed only along one edge of the N-type diffusion layer 13. On the other hand, in the check elements of the second embodiment, the P-type channel barrier region 22 is formed to surround all four edges of the flat, square N-type diffusion layer 13. As a result, the junction withstand voltage of the P-type channel barrier region 22 and N-type diffusion layer 13 can be measured, even if the P-type channel barrier region 22 is misplaced because of misplacement in relation to the N-type diffusion layer 13 or field oxide 51. For this reason, the state of the impurities in the P-type channel barrier region can be evaluated. If the P-type channel barrier region in the check elements is misplaced, the P-type channel barrier region in the circuit element region is also misplaced. Consequently, this embodiment has no problem even if the position of the P-type channel barrier region in the circuit element region is somewhat misplaced and is used in a semiconductor device where the concentration of impurities therein is important.

In other words, in FIG. 6(A), because the P-type channel barrier region 22 is misplaced to the left and down in relation to the N-type diffusion layer 13, the N-type diffusion layer 13 and the P-type channel barrier region 22 overlap at the contact location 29A on the right side and top side (top side in the planar view (A)), and the N-type diffusion layer 13 and P-type channel barrier region 22 are separated at the contact location 29B on the left side and bottom side (bottom side in the planar view (A)). If separated, the concentration of P-type impurities approaches the concentration of impurities in the P-type substrate (50) and the junction withstand voltage becomes high. However, because the P-type channel barrier region 22 is formed in a single ring shape, a low junction withstand voltage is measured at the contact location 29A; as a result, the impurities in the P-type channel barrier region can be evaluated. Moreover, as a variation of this embodiment, the P-type channel barrier region can also be established on two or three edges of the N-type diffusion layer in the check elements.

The check elements of the embodiment in FIG. 7 are also for evaluating the misregistration of the N-type diffusion layer and P-type channel barrier region.

The N-type diffusion layers 33A, 33B, 33C, 33D are formed independently of each other on four edges of the square, flat P-type channel barrier region 32 in the center. Aluminum electrodes 37A, 37B, 37C, 37D are drawn independently therefrom and through the contact hole 38. In this example, the P-type channel barrier region 32 is misplaced to the left and downwards in relation to the N-type diffusion layer. As a result, the P-type channel barrier region 32 and N-type diffusion layers 33A, 33C are separated at the contact location 39A on the right and top sides (top side in planar view (A)); and the P-type channel barrier region 32 and N-type diffusion layers 33B, 33D overlap at the contact location 39B on the left side and bottom side (bottom side in planar view (A)).

In this case, the junction withstand voltage is found to be high in the case where the measurement probe contacts the aluminum electrodes 37A and 37C; the junction withstand voltage is found to be low in the case where the measurement probe contacts the aluminum electrodes 37B and 37D. Because of this, it is confirmed that the P-type channel barrier region is misplaced to the left and downward in relation to the N-type diffusion layers in the check elements; in the circuit element region as well, it can be confirmed that the separated P-type channel barrier region is misplaced to the left and downward in relation to the N-type source and drain regions.

Next, a method for quantitatively evaluating the amount of misplacement is explained using the check elements as in FIG. 7.

Moreover, this explanation is made for direction X, but also applies to the direction Y in FIG. 7.

When there is no misplacement, the central P-type channel barrier region 32 and each of the N-type diffusion layers 33B, 33A on the left and right are formed. In concrete terms, for example, five elements, overlapping 2 μm (+2.0 μm check element), overlapping 1 μm (+1.0 μm check element), being in flush contact (0 μm check element), being separated by 1 μm (−1.0 μm check element), and being separated by 2 μm (−2.0 μm check element), are formed. The check elements are actually formed at the same time as the MOS transistor and P-type channel barrier region in the circuit element region.

This explanation concerns the case where the P-type channel barrier region at a misplacement of 1.5 μm to the left from the true position is formed because of a mask misregistration. In other words, the P-type channel barrier region is misplaced 1.5 μm to the left in relation to the N-type diffusion layers for each check element, and in relation to the N-type source and drain regions for the circuit element region.

For a +2.0 μm check element, the N-type diffusion layers on the left and right overlap with the P-type channel barrier region; therefore, a low withstand voltage (8 V, for example) is measured.

For a +1.0 μm check element, the N-type diffusion layer on the left overlaps with the P-type channel barrier region; therefore the withstand voltage is low. However, the N-type diffusion layer on the right is separated from the P-type channel barrier region because of the misplacement of the P-type channel barrier region and its junction withstand voltage is with the low density P-type substrate; therefore a high withstand voltage of 16 V, for example, is measured. For a 0 μm check element and −1 μm check element, the N-type diffusion layer on the left overlaps with the P-type channel barrier region and therefore withstand voltage is low. However, the N-type diffusion layer on the right is separated from the P-type channel barrier region and therefore the withstand voltage is high. For a −2 μm check element, the misplacement is 1.5 μm to the left and the N-type diffusion layer on the left and P-type channel barrier region are still separated; therefore the withstand voltage is high. Also, the N-type diffusion layer on the right is also more separated from the P-type channel barrier region and therefore has a high withstand voltage.

Figure 8:
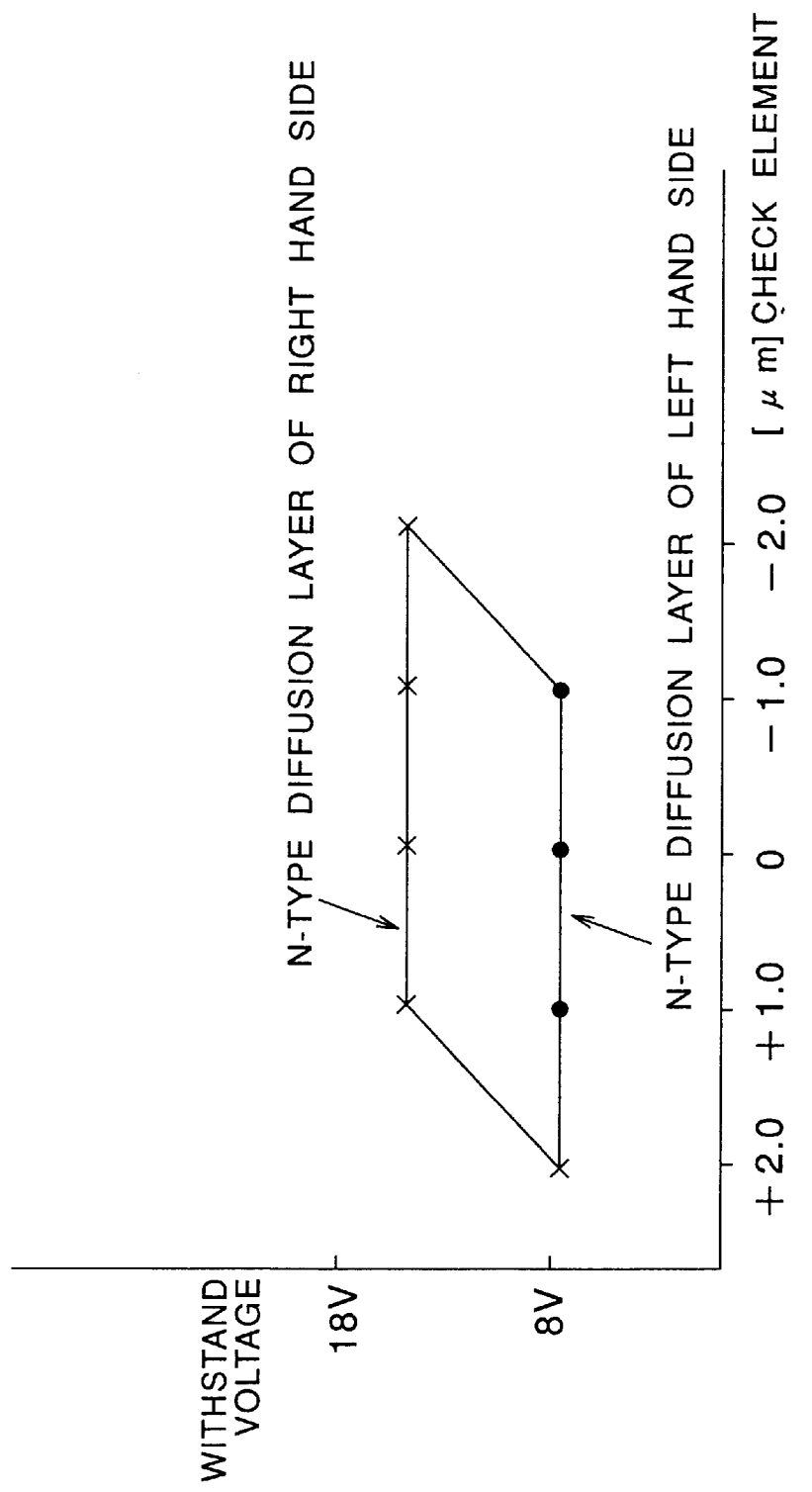
FIG. 8 is a drawing to show the method for finding the amount of misplacement using the check elements in the third embodiment.

FIG. 8 shows the resultant graph of this situation. Accordingly, it is determined that the P-type channel barrier region is formed at a misplacement toward the left of greater than 1 μm and less than 2 μm.

If many check elements are formed with less variation, the amount of misplacement of the P-type channel barrier region can be found more precisely. Or, when the approximate amount of misplacement is known in advance, the amount of misplacement of the P-type channel barrier region can be found more precisely if check elements are formed with slight variation in relation to the vicinity thereof.

Figure 9:
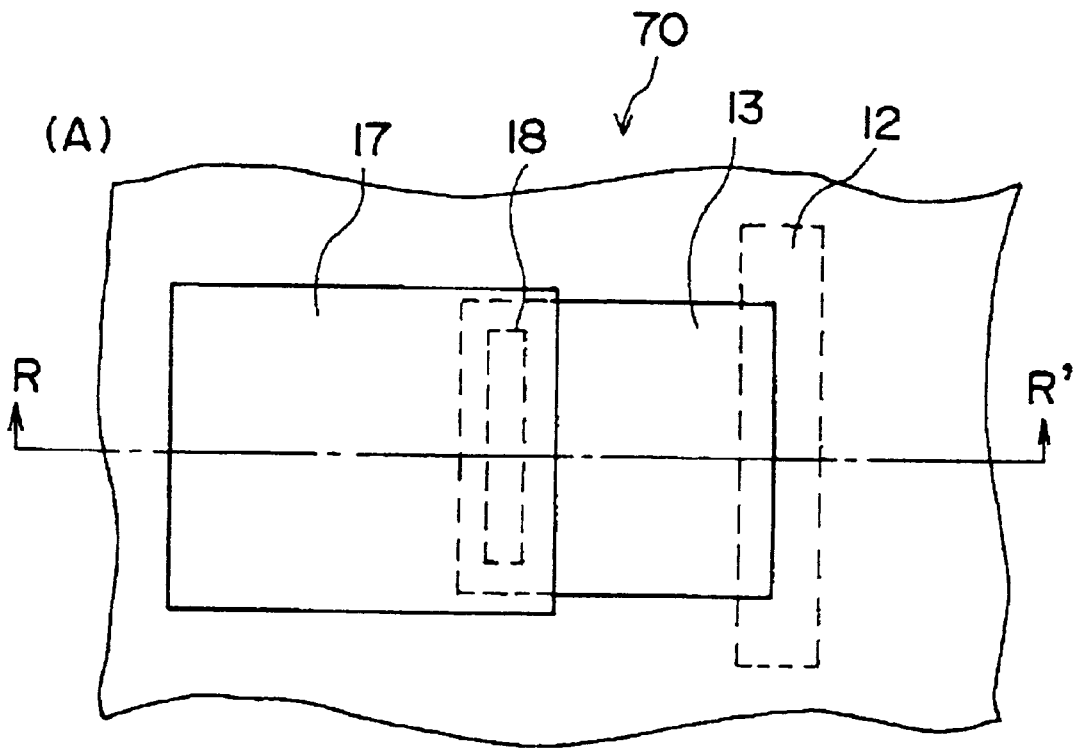
FIG. 9 is a drawing to show the check elements in the semiconductor device in a fourth embodiment of the present invention; (A) is a planar view; (B) is a sectional view of (A) at line R–R' and seen from the direction of the arrow.
Figure 9:
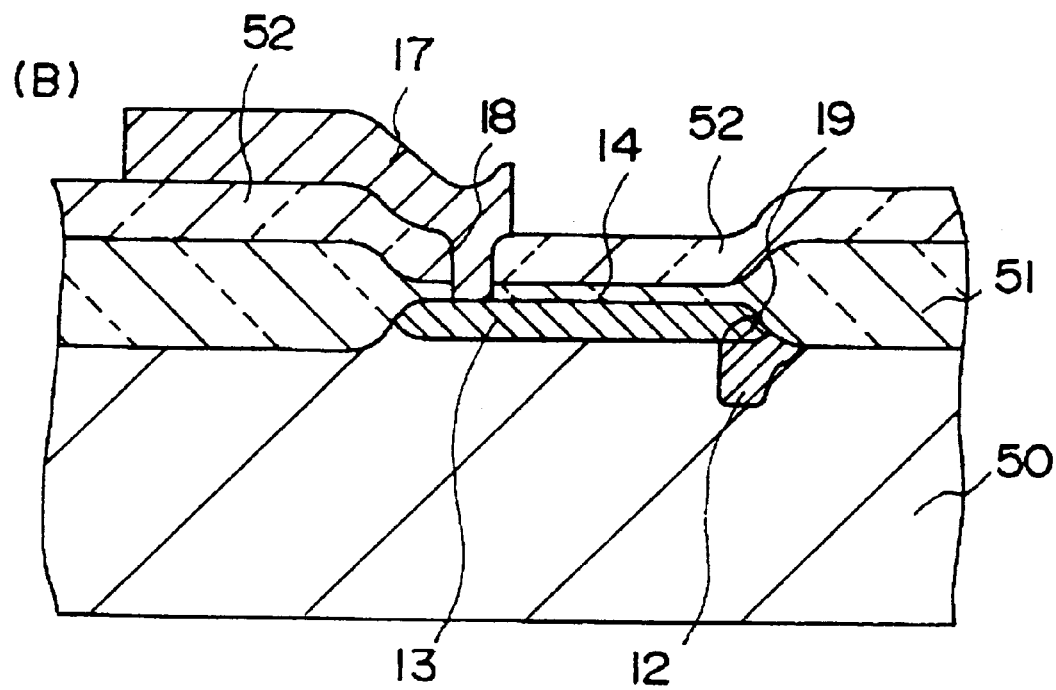

FIG. 9 is a drawing to show check elements in the semiconductor device of the fourth embodiment of the present invention. FIG. 9(A) is a planar view and FIG. 9(B) is a sectional view taken at line R–R' in FIG. (A). In FIG. 9, sections identical or similar to portions of FIG. 3 showing the first embodiment are represented with the same symbols and the relation to the circuit element region is the same as that in FIGS. 1 and 2 of the first embodiment; therefore a redundant explanation thereof is omitted. In the first embodiment, the overlap of the N-type diffusion layer 13 and P-type channel barrier region 12 has sufficient width. On the other hand, in the check element of the fourth embodiment, the overlap of the N-type diffusion layer 13 and P-type channel barrier region 12 is less than 0.2 μm.

Generally, when ions are implanted from the normal direction (this is an implantation angle of 0°) of the principal plane of the wafer in order to eliminate channelling in the substrate, sometimes the ions are implanted at an angle (this is an ion implantation angle of 7°) which is 7° from the normal direction of the principal plane of the wafer, to suppress lateral spread of the elements. The P-type channel barrier region 12 is implanted at 0° to suppress lateral spread. An error in dose in this ion implantation operation can be checked in the first embodiment shown above (FIG. 3), but an error in the ion implantation angle cannot be checked. In this fourth embodiment (FIG. 9), the overlap of the N-type diffusion layer 13 and the P-type channel barrier region 12 is 0.2 μm or less. As a result, an overlapping portion of the N-type diffusion layer 13 and the P-type channel barrier region 12 is not produced, because the thickness of the resist is 1 μm for an implantation at 7°, and the junction withstand voltage remains high.

Thereby it is understood that the implantation angle for ion implantation of the P-type channel barrier region 12 was 0°, but the region was implanted at 7°.

Figure 10:
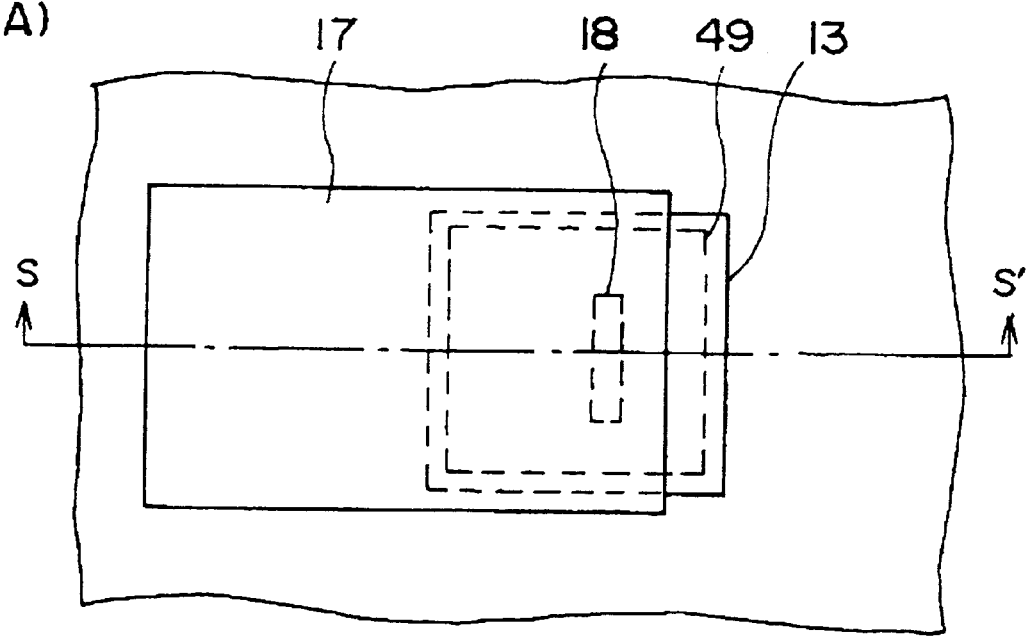
FIG. 10 is a drawing to show the check elements in the semiconductor device in a fifth embodiment of the present invention; (A) is a planar view; (B) is a sectional view of (A) at line R–R' sic should probably read S–S' and seen from the direction of the arrow.
Figure 10:
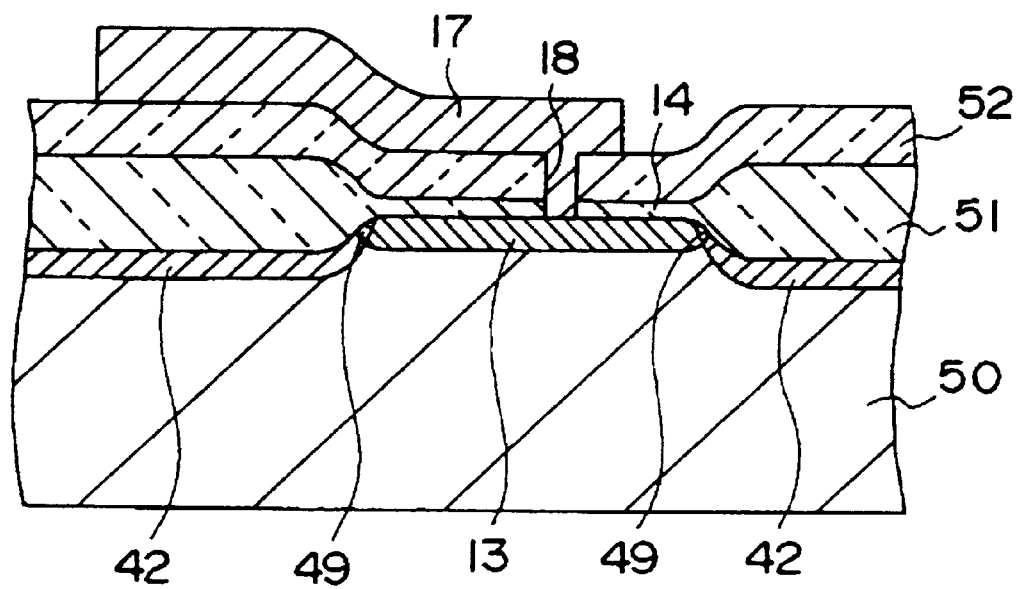

FIG. 10 is a drawing to show the check elements for the semiconductor device in the fifth embodiment of the present invention; FIG. 10(A) is a planar view and FIG. 10(B) is a sectional view taken at line S–S' of FIG. 10(A). In FIG. 10, sections identical or similar to portions of FIG. 3 showing the first embodiment are represented with the same symbols and the relation to the circuit element region is the same as that in FIGS. 1 and 2 of the first embodiment; therefore a redundant explanation thereof is omitted.

In FIG. 10, the P-type channel barrier region 42 is formed in the circuit element region and check element region below the entire field oxide 51. Consequently, even when the concentration of impurities in the P-type channel barrier region is not made so high density in the circuit element region, this is appropriate for a semiconductor device which does not require a high junction withstand voltage for the N-type source and drain regions and a semiconductor device where element separation is possible. In the circuit element region, part of the P-type channel barrier region 42 and the N-type diffusion layer 13 overlap at the contact location 49, which is inclined upwards toward the substrate surface along the area below the pointed end of the field oxide 51, and the state of the P-type channel barrier region 42 is evaluated according to the junction withstand voltage of that location.

Figure 11:
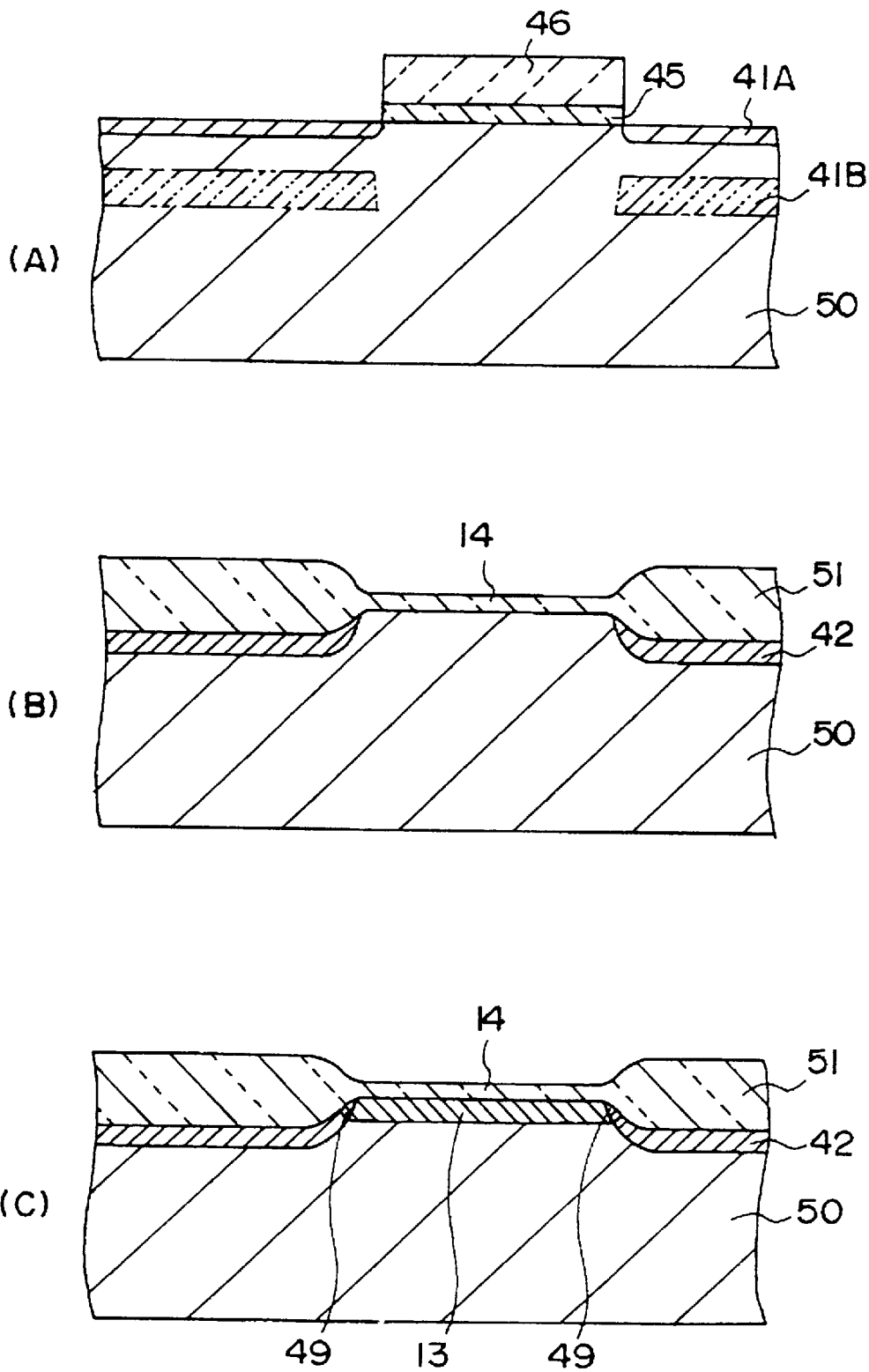
FIG. 11 is a sectional view to show the order of processes in the method for manufacturing the semiconductor device in the fifth embodiment of the present invention.
Figure 13:
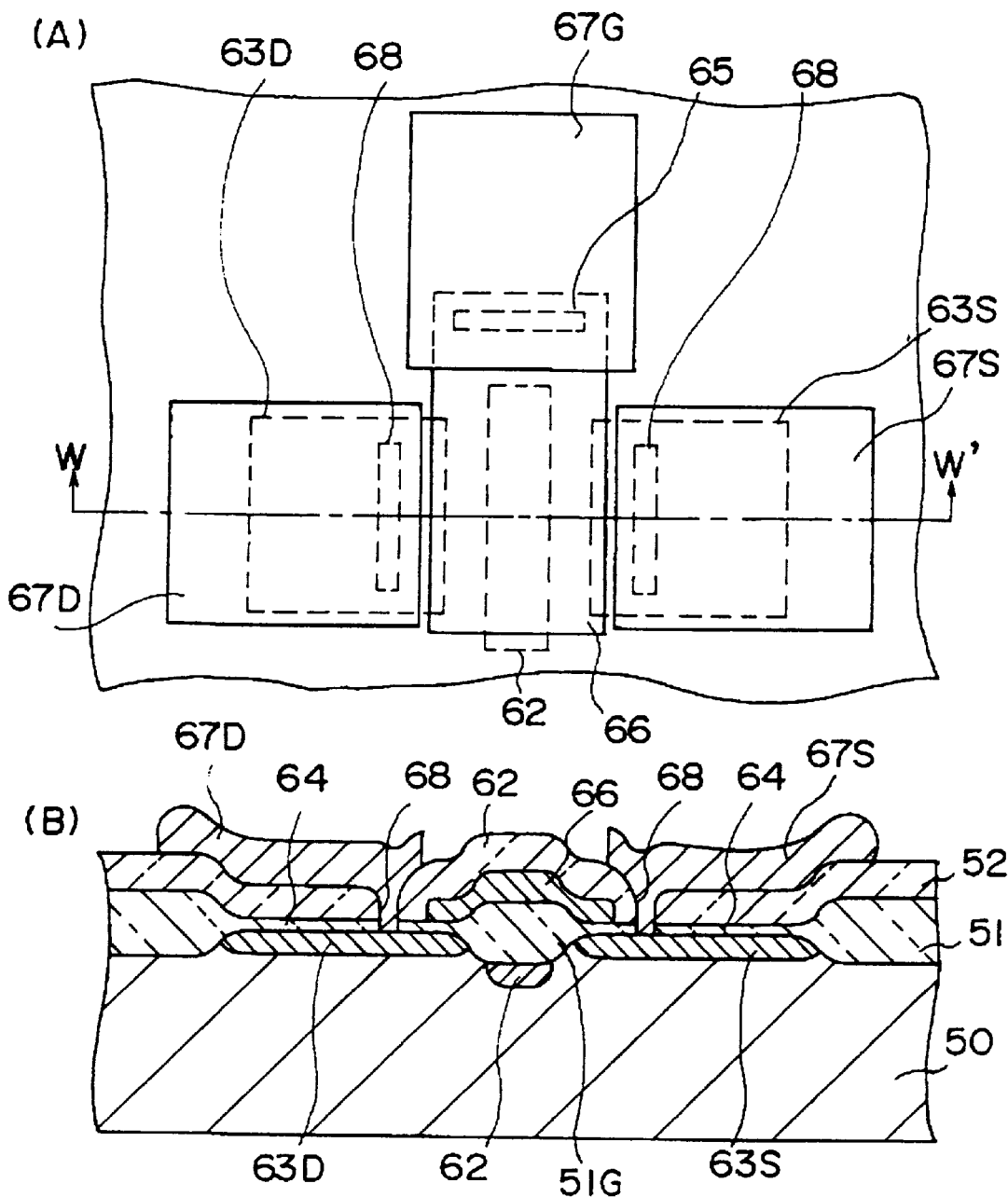
FIG. 13 is a drawing to show the check elements in the semiconductor device of the prior art; (A) is a planar view; (B) is a sectional view of (A) at line W–W' and seen from the direction of the arrow.

Next, the method for manufacturing the semiconductor device of the fifth embodiment is explained with reference to FIGS. 11 and 12. As discussed above, the circuit elements and check elements are manufactured at the same time; only check elements are shown here. A silicon nitride film 45 with a thickness of 120 nm was grown on the entire surface of the principal plane of the P-type semiconductor substrate 50 doped with $1\times10^{15}$ cm$^{-3}$; a photoresist pattern 46 was formed thereon and the silicon nitride film 46 was selectively etched away using this photoresist pattern 46 as the mask; and boron was implanted on the principal plane portion of the substrate to become the field region, at an energy of 100 keV and a dose of $1\times10^{13}$ cm$^{-2}$, to form a P-type ion implanted layer 41A. Or, boron was implanted at an energy of 300 keV and a dose of 1×1013 cm$^{-2}$ to form a P-type ion implanted layer 41B, implanted at high energy in the interior of the substrate (FIG. 11(A)).

Next, after the photoresist pattern 46 is removed, the field oxide 51 is selectively formed by the selective thermal oxidation method using the silicon nitride film 45 as a mask. At this time, the ion implanted layer 41A or 41B is activated, adheres to the bottom surface of the field oxide 51, and becomes the P-type channel barrier region 42, facing upwards toward the substrate surface along the bottom of the pointed end of the field oxide 51.

Afterwards, the silicon nitride film 45 is removed and a gate oxide is formed in the circuit element region with thermal oxidation; at the same time, a thin oxide film 14 is formed in the check element region. These oxide films are 20 nm thick (FIG. 11(B)).

Next, after the polysilicon gate electrode is formed in the circuit element region, arsenic is implanted at an energy of 70 keV and a dose of $1\times10^{12}$ cm$^{-2}$ using the field oxide 51 and polysilicon gate electrode as the mask. Then, with the alloying heat treatment, the N-type source and drain region is formed in the circuit element region and the N-type diffusion layer 13, which overlaps with the P-type channel barrier region 42 at the contact location 49, is formed in the check element region on the substrate in the opening of the field oxide 51 (FIG. 11(C)).

Next, the BPSG film 52, to be the interlayer insulating film, is formed over the entirety (FIG. 12(A)) and the contact hole 18 is formed. The aluminum electrode wiring in the circuit element region and the aluminum electrode 17 in the check element region are formed at the same time by the deposition and patterning of an aluminum film (FIG. 12(B)).

Moreover, in this embodiment as well, the formation of source and drain regions of a P-channel MOS transistor and processes such as the doping of that channel are performed, especially in the case where a CMOS is formed in the circuit element forming region. However, these are omitted from this explanation as they are not directly related to the present invention. The manufacturing methods shown in FIGS. 10 and 11 are explained using a P-type semiconductor substrate, but may also be used in the P-type well portion (P-type well doped with $10^{16}$ cm$^{-3}$ of boron) of a P-type semiconductor substrate or an N-type semiconductor substrate, as in the case of the manufacturing methods for prior embodiments. With the present invention as explained above, an N-type diffusion layer, in the form of a small, isolated square, is established on one portion of the P-type semiconductor substrate or P-type well; a P-type channel barrier region for element separation is placed in contact with at least one edge of this N-type diffusion layer; and the construction of the P-type channel barrier region, specifically, element separation, is checked by the measurement of the junction withstand voltage of the N-type diffusion layer. Consequently, element separation can be evaluated with good sensitivity and without true breakdown of a thin oxide film on the N-type diffusion layer and without influence from variations in the thickness of the field oxide during this check. Also, the pattern area for checking can be made small. Furthermore, the misplacement of the P-type channel barrier region can also be easily evaluated.

The invention may be embodied in other specific forms without departing from the spirit or essential characteristic thereof. The present embodiments is therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosure of Japanese Patent Application No. 8-128137 (Filed on May 23rd, 1996) including specification, claims, drawings and summary are incorporated herein by reference in its entirety.

What is claimed is:

1. A semiconductor device comprising check elements to check the junction withstand voltage of the semiconductor and such elements comprising;

four isolated N-type diffusion layers each isolated and formed in a square shape on one part of a P-type semiconductor substrate or a P-type well;

a P-type channel barrier region in the form of a square formed such that each of the N-type diffusion layers contacts an edge of said P-type channel barrier region and said P-type channel barrier region overlaps at least part of at least one of said N-type diffusion layers; and an electrode drawn from each of the N-type diffusion layers through a contact hole wherein the state of the P-type channel barrier region can be checked by measuring the junction withstand voltage of the N-type diffusion layer.

* * * * *